(12) United States Patent
Srinivasa et al.

(10) Patent No.: US 8,159,382 B2
(45) Date of Patent: Apr. 17, 2012

(54) LOW POWER CONVERTER AND SHUTDOWN SAR ADC ARCHITECTURE

(75) Inventors: Raghu N. Srinivasa, Bangalore (IN); Sandeep K. Oswal, Pune (IN)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 12/776,109

(22) Filed: May 7, 2010

(65) Prior Publication Data
US 2011/0128172 A1 Jun. 2, 2011

(30) Foreign Application Priority Data
Nov. 27, 2009 (IN) ............................ 2925/CHE/2009

(51) Int. Cl.
*H03M 1/12* (2006.01)
(52) U.S. Cl. ...................... 341/156; 341/155; 341/172
(58) Field of Classification Search .................. 341/156, 341/155, 172, 118, 120, 119, 161, 163, 150
See application file for complete search history.

(56) References Cited

U.S. PATENT DOCUMENTS

| | | | |
|---|---|---|---|
| 4,399,426 A * | 8/1983 | Tan | 341/120 |
| 5,138,319 A | 8/1992 | Tesch | |
| 6,124,818 A | 9/2000 | Thomas et al. | |
| 6,707,403 B1 * | 3/2004 | Hurrell | 341/120 |
| 6,720,903 B2 * | 4/2004 | Confalonieri et al. | 341/172 |
| 6,879,277 B1 | 4/2005 | Cai | |
| 6,882,295 B2 | 4/2005 | Leung | |
| 6,882,298 B2 | 4/2005 | Leung et al. | |
| 6,914,550 B2 | 7/2005 | Cai | |
| 6,950,052 B2 | 9/2005 | Leung | |
| 6,954,170 B2 | 10/2005 | Leung | |
| 6,956,520 B2 | 10/2005 | Leung et al. | |
| 6,958,722 B1 | 10/2005 | Janakiraman et al. | |
| 6,977,607 B2 | 12/2005 | Leung et al. | |
| 6,985,101 B2 | 1/2006 | Leung et al. | |
| 7,167,121 B2 * | 1/2007 | Carreau et al. | 341/150 |
| 7,173,556 B2 * | 2/2007 | Kobayashi et al. | 341/161 |
| 7,199,745 B2 * | 4/2007 | Tachibana et al. | 341/163 |

FOREIGN PATENT DOCUMENTS
EP 0559657 3/1992
WO WO9204777 3/1992
* cited by examiner

*Primary Examiner* — Jean B Jeanglaude
(74) *Attorney, Agent, or Firm* — John J. Patti; Wade J. Brady, III; Frederick J. Telecky, Jr.

(57) ABSTRACT

With Successive Approximation Register (SAR) analog-to-digital converters (ADCs), there are several different architectures. One of these architectures is a "convert and shut down" architecture, where an internal amplifier is powered down during the sampling phase to reduce power consumption. This powering down comes at a price in that a portion of the convert phase is lost waiting for the amplifier to be powered back up. Here, an apparatus is provided that makes use of the entire convert phase by coarsely resolving a few bits during the period in which the amplifier is powering up to have an increased resolution over conventional SAR ADCs with "convert and shut down" architecture, while maintaining low power consumption.

17 Claims, 4 Drawing Sheets

US 8,159,382 B2

LOW POWER CONVERTER AND SHUTDOWN SAR ADC ARCHITECTURE

CROSS-REFERENCE TO RELATED APPLICATIONS

This application claims priority from Indian Patent Application No. 2925/CHE/2009, filed Nov. 27, 2009, which is hereby incorporated by reference for all purposes.

TECHNICAL FIELD

The invention relates generally to an analog-to-digital converter (ADC) and, more particularly, to a successive approximation registers (SAR) ADC.

BACKGROUND

Turning to FIG. 1 of the drawings, a timing diagram for a conventional SAR analog to digital converter (ADC) with a "convert and shut down" architecture can be seen. As can be seen, a conventional SAR ADC samples during the sample phase of the sample clock S (which has a period of operation $T_S$) and converts during the convert phase of sample clock S. A amplifier, which is commonly used in the SAR ADC, is powered down during the sample phase and is powered up on the falling edge of the sample clock S. However, power-up of the amplifier or preamplifier requires time, TOC, which reduces the conversion period, TC. Thus, the speed or resolution of the SAR ADC is sacrificed for reduced power consumption.

Some examples of conventional devices are: European Patent No. 0559657; U.S. Pat. Nos. 5,138,319; 6,124,818; 6,879,277; 6,882,295; 6,882,298; 6,914,550; 6,950,052; 6,954,170; 6,956,520; 6,958,722; 6,977,607; 6,985,101; and PCT Publ. No. WO1992004777.

SUMMARY

A preferred embodiment of the present invention, accordingly, provides an apparatus. The apparatus comprises a switched capacitor array that receives an input signal; an amplifier; a first comparator that is coupled to the amplifier; a second comparator; a switch network that couples to the switched capacitor array to the second comparator during a first portion of a convert phase so that the switched capacitor array and the second comparator resolve a first plurality of bits and that couples the switched capacitor array to the amplifier during a second portion of the convert phase so that the switched capacitor array and the first comparator resolve a second plurality of bits; and a feedback circuit that is coupled to the first comparator, the second comparator, and the switched capacitor array.

In accordance with a preferred embodiment of the present invention, the switched capacitor array further comprises: a plurality of switches, wherein each switch receives the input signal; and a plurality of capacitors, wherein each capacitor is coupled to at least one of the switches.

In accordance with a preferred embodiment of the present invention, the switched capacitor array further comprises: a first switched capacitor array having a first resolution that receives the input signal, wherein the switch network couples the first switched capacitor array to the amplifier during the second portion of the convert phase so that the first switched capacitor array and the first comparator resolve the second plurality of bits, and wherein the first switched capacitor array is coupled to the feedback circuit; and a second switched capacitor array having a second resolution that receives the input signal, wherein the first resolution is greater than the second resolution, wherein the switch network couples to the second switched capacitor array to the second comparator during the first portion of a convert phase so that the second switched capacitor array and the second comparator resolve the first plurality of bits, and wherein the second switched capacitor array is coupled to the feedback circuit.

In accordance with a preferred embodiment of the present invention, the second switched capacitor array further comprises: a first switch; a first capacitor that is coupled to the first switch; a second switch that is coupled to first switch; a second capacitor that is coupled to the second switch; a third switch that is coupled to first switch; a third capacitor that is coupled to the third switch; a fourth switch that is coupled to first switch; and a fourth capacitor that is coupled to the fourth switch.

In accordance with a preferred embodiment of the present invention, the switch network further comprises: a first switch that is coupled the first and second switched capacitor arrays, wherein first switch couples the first switched capacitor array to the amplifier during the second portion of the convert phase; and a second switch that is coupled to the amplifier, wherein the second switch coupled the amplifier to ground during the first portion of the convert phase; and a third switch that is coupled to the amplifier, wherein the third switch couples the amplifier to ground during the first portion of the convert phase.

In accordance with a preferred embodiment of the present invention, the apparatus further comprises: an offset capacitor that is coupled between the amplifier and the first comparator; and a switch that is coupled to the first comparator, wherein the switch couples the first comparator to ground during the first portion of the convert phase.

In accordance with a preferred embodiment of the present invention, the feedback circuit further comprises: a multiplexer that is coupled to the first comparator and to the second comparator; and successive approximation register (SAR) logic that is coupled to the multiplexer, the first switched capacitor array and the second switched capacitor array.

In accordance with a preferred embodiment of the present invention, the switch network further comprises: a first switch that is coupled to the switched capacitor array, wherein the first switch is couples the switched capacitor array to ground during a sample phase; a second switch that is coupled the switched capacitor array, wherein second switch couples the switched capacitor array to the amplifier during the second portion of the convert phase; and a third switch that is coupled to the amplifier, wherein the third switch couples the amplifier to ground during the first portion of the convert phase.

In accordance with a preferred embodiment of the present invention, an apparatus is provided. The apparatus comprises a switched capacitor array; a first switch that is coupled to the switched capacitor array, wherein the first switch couples at least a portion of the switched capacitor array to ground during a sampling phase; a first comparator that is coupled to the switched capacitor array, wherein the switched capacitor array and the first comparator resolve a first plurality of bits during a first portion of a convert phase; an amplifier having an input terminal and an output terminal; a second switch that is coupled between the switched capacitor array and the input terminal of the amplifier, wherein the second switch couples the switched capacitor array to the amplifier during a second portion of a convert phase; a third switch that is coupled to the input terminal of the amplifier, wherein the third switch couples the input terminal of the amplifier to ground during the first portion of the convert phase; an offset capacitor that is coupled to the output terminal of the amplifier; a second comparator that is coupled to the offset capacitor; a fourth switch that is coupled to second comparator, wherein the fourth switch couples the second comparator to ground during the first portion of the convert phase; a multiplexer that is coupled to the first comparator and the second comparator; and SAR logic that is coupled to the multiplexer and the switched capacitor array.

In accordance with a preferred embodiment of the present invention, the switched capacitor array further comprises: a first switched capacitor array having a set of N branches, wherein the first switch couples at least a portion of the first switched capacitor array to ground during the sampling phase, and wherein the second switch couples the first switched capacitor array to the amplifier during the second portion of the convert phase; and a second switched capacitor array having a set of M branches, wherein N is greater than M, wherein the first switch couples at least a portion of the second switched capacitor array to ground during the sampling phase, and wherein the second switched capacitor array is coupled to the first comparator, and wherein the second switched capacitor array and the first comparator resolve the first plurality of bits during the first portion of the convert phase.

In accordance with a preferred embodiment of the present invention, each branch further comprises: a digital-to-analog converter (DAC) capacitor that is coupled to the first switch; and an input switch that is coupled to the DAC capacitor.

In accordance with a preferred embodiment of the present invention, M is 4.

In accordance with a preferred embodiment of the present invention, a method is provided. The method comprises sampling an input signal by a switched capacitor array during a sampling phase; powering up an amplifier during a first portion of a convert phase; resolving a first set of bits with the switched capacitor array, a first comparator, and a feedback circuit during the first portion of the convert phase; and resolving a second set of bits with the switched capacitor array, a second comparator, the amplifier, and a feedback circuit during a portion of the convert phase.

In accordance with a preferred embodiment of the present invention, the method further comprises grounding an input terminal of the amplifier during the first portion of the convert phase.

In accordance with a preferred embodiment of the present invention, the switched capacitor array further comprises a first switched capacitor array and a second switched capacitor array.

In accordance with a preferred embodiment of the present invention, the step of resolving the first set of bits further comprises resolving the first set of bits with the first switched capacitor array, a first comparator, and a feedback circuit during the first portion of the convert phase.

In accordance with a preferred embodiment of the present invention, the step of resolving the second set of bits further comprises resolving the second set of bits with the second switched capacitor array, a second comparator, the amplifier, and a feedback circuit during a portion of the convert phase.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
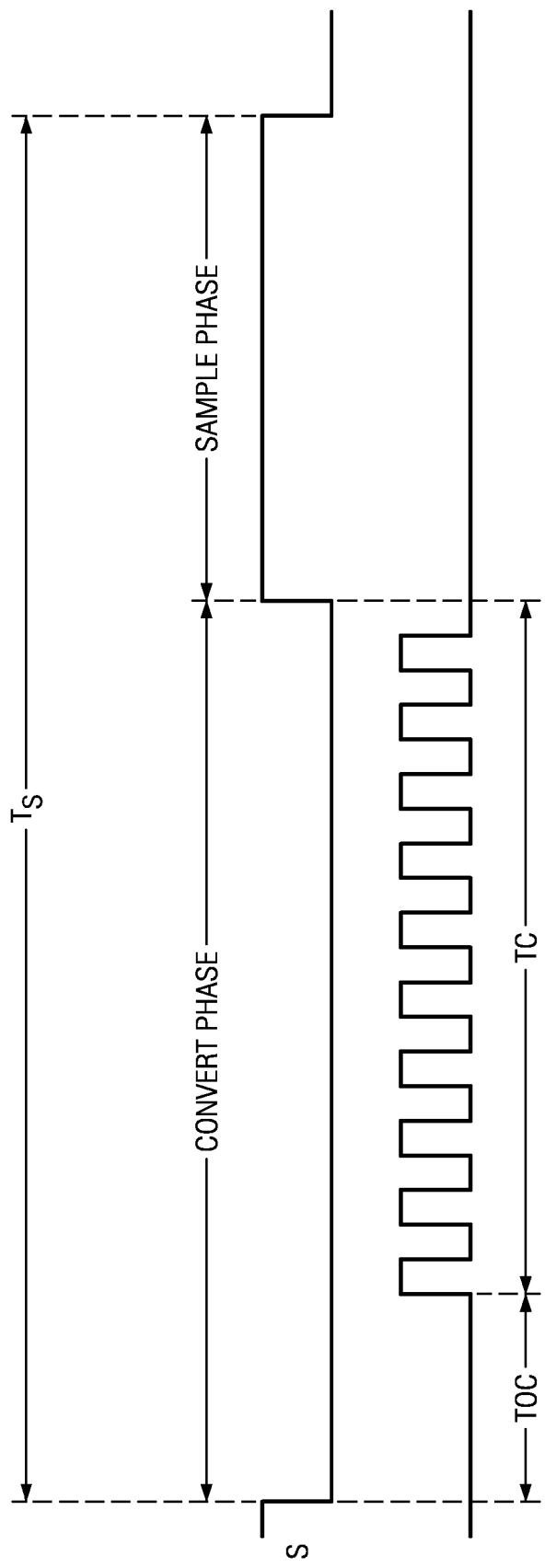
FIG. 1 is an example of a timing diagram for a conventional SAR DAC.

Refer now to the drawings wherein depicted elements are, for the sake of clarity, not necessarily shown to scale and wherein like or similar elements are designated by the same reference numeral through the several views.

Figure 2A:
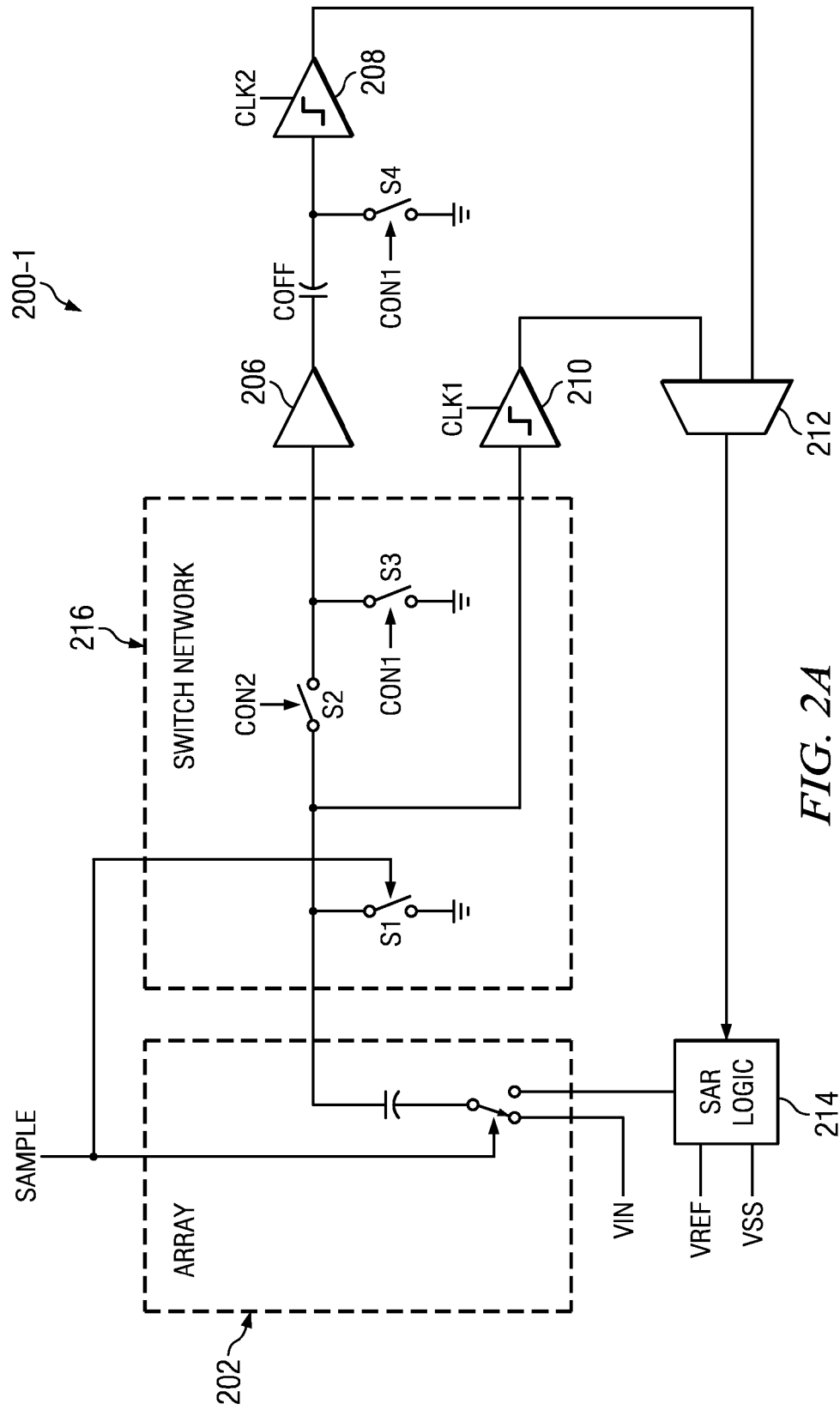
FIGS. 2A and 2B are circuit diagrams depicting examples of a SAR ADC in accordance with a preferred embodiment of the present invention.

Referring to FIG. 2A of the drawings, reference numeral 200-1 generally designates an example of a SAR ADC in accordance with a preferred embodiment of the present invention. The SAR ADC 200-1 generally comprises a switched capacitor array or digital-to-analog converter (DAC) 202, switch network 216, amplifier 206, offset capacitor COFF, switch S4, comparators 208, and 210, multiplexer or mux 212, and SAR logic 214 (which receives voltages VREF and VSS). The switch network 214 also generally comprises switches S1, S2, and S3.

Figure 3:
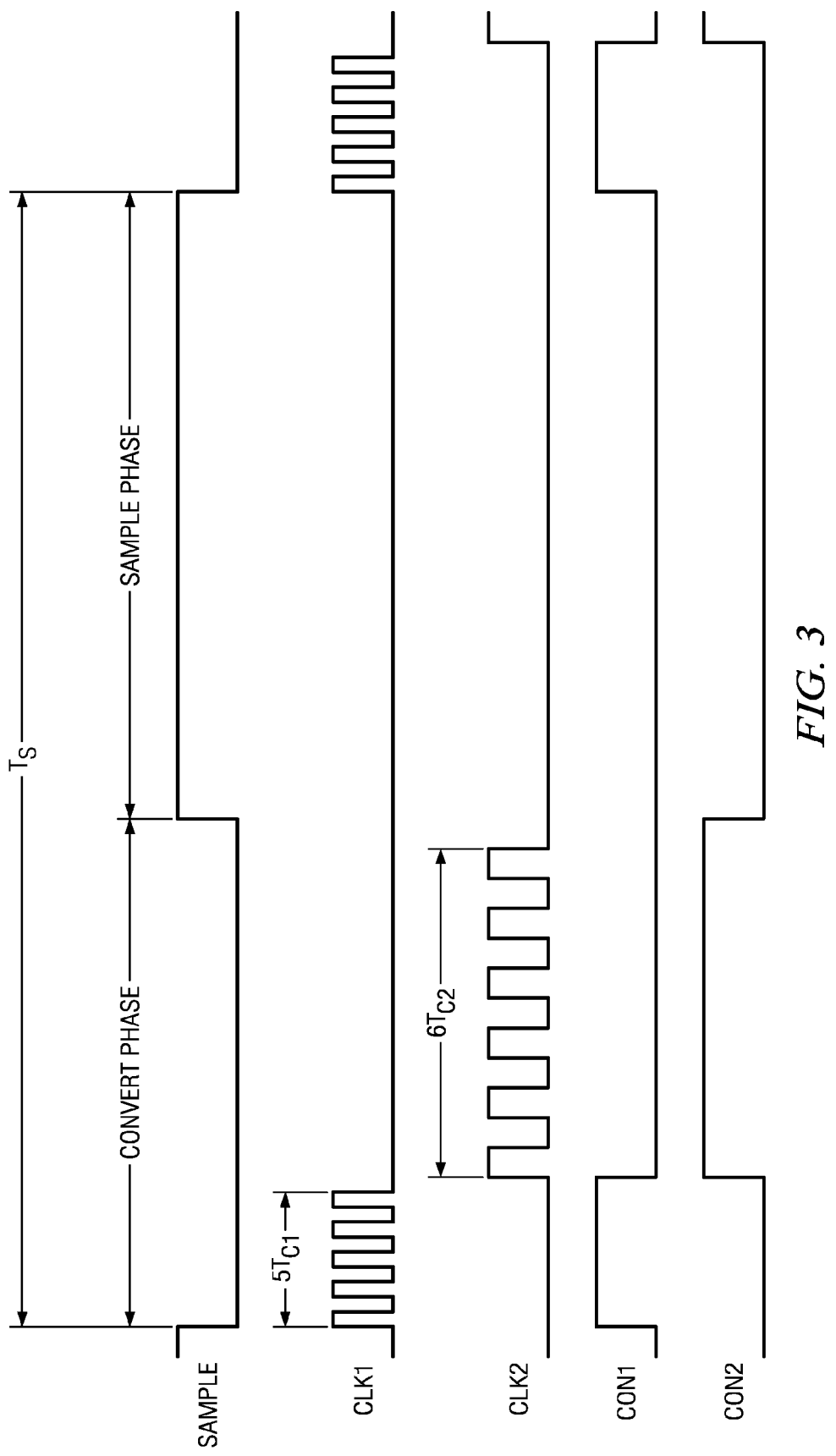
FIG. 3 is an example of a timing diagram for the SAR DACs of FIGS. 3A and/or 3B.

SAR ADC 200-1 has a "convert and shut down" architecture that shuts down or powers down amplifier 206 during a sample phase, and, in operation, the ADC 200-1 (instead of wasting the power-up time of the amplifier 206) coarsely resolves bits. As can be seen in FIG. 3, there are two primary phases for ADC 200-1 (the convert phase and the sample phase) which occur during one period of operation $T_s$ of the sample signal SAMPLE. During the sample phase (when the sample signal SAMPLE is logic high), switch 51 is closed to ground a plate for each capacitor within array 202, and switches within array 202 allow an input signal VIN to be applied to the other plate for each capacitor within array 202. This allows each capacitor within the array 202 to be charged to the voltage from the input signal VIN at that sampling instant.

Upon completion of the sampling phase (and entrance into the convert phase with the sample signal SAMPLE transitioning to logic low), switch 51 is opened and the switches within array 202 are coupled to the feedback circuit (SAR logic 214 and mux 212). On the falling edge of sample signal SAMPLE, clock signal CON1 transitions to logic high for the first portion of the convert phase, which closes switches S3 and S4 to coupled the input terminals of amplifier 206 and comparator 208 to ground. Thus, during this first portion of the convert phase, comparator 210 is coupled to array 202. This allows the array 202, comparator 210, mux 212, and SAR logic 214 to revolve the first set of bits over a predetermined number of periods (for example five bits over five periods ($5T_{C1}$) of clock signal CLK1) in a coarse manner using a SAR algorithm. These initial periods of clock signal CLK1 are generally long enough to allow for power-up of amplifier 206, so that after the resolution of this initial set of bits, clock signal CON1 transitions to logic low, while clock signal CLK2 transitions to logic high. During this second portion of the convert phase, switch S2 is closed so that amplifier 206, offset capacitor COFF, comparator 208, mux 212, and SAR logic 214 can resolve the next set of bits (for example five bits plus one error bit to account for the error in the initial five bits resolved in a coarse manner) over a predetermined number of periods (for example, six periods ($6T_{C2}$) of clock signal CLK2). Therefore, the time wasted in conventional ADCs waiting for a preamplifier to power up is used, so that higher speeds and/or resolution can be achieved with reduced power consumption.

Figure 2B:
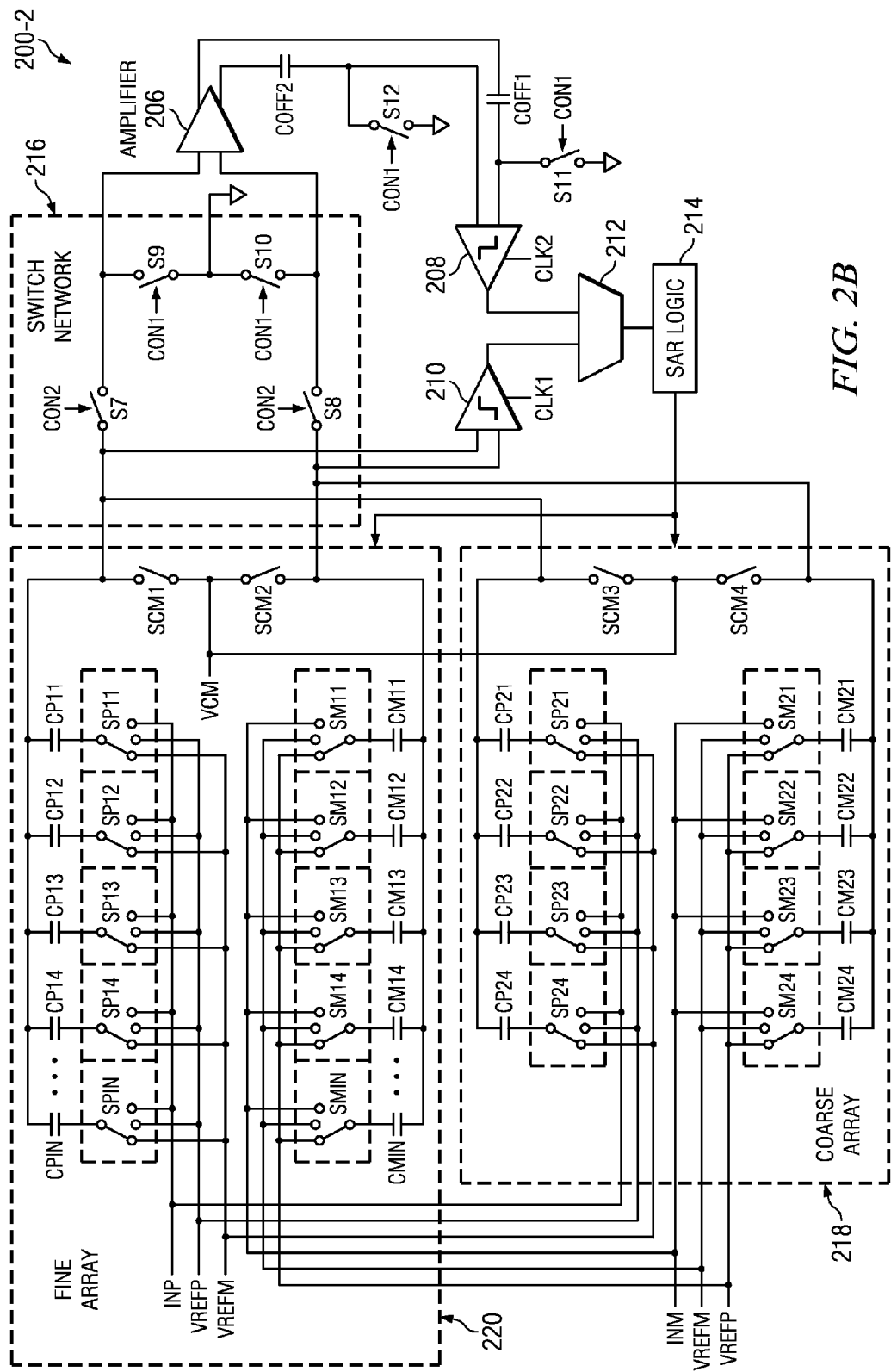

Turning now to FIG. 2B, ADC 200-2 can be seen. Some differences between ADC 200-1 and 200-2 are that ADC 200-2 is shown in differential form and includes a coarse switched capacitor array 218 and a fine switched capacitor array 220. Because the ADC 200-2 is in differential form, several pairs of switches in ADC 200-2 can correspond to switches in ADC 200-1, operating in accordance with the timing diagram of FIG. 3. Namely, switches S1, S2, S3, and S4 generally correspond to switch pairs SCM1 through SCM4, S7/S8, S9/S10, and S11/S12 (respectively). In operation, though, array 218 is used in conjunction with comparator 218 to perform coarse resolution of bits, while array 220 is used in conjunction with amplifier 206 and comparator 210 to perform fine resolution of bits.

Looking first to the coarse array 218, it employs smaller capacitors than fine array 220, which is desirable for an initial, coarse resolution of bits. As shown, array 218 has two halves (each corresponding to a portion of a differential input) with four stages (more or less, however, can be included). Each of the array switches from the positive half SP21, SP22, SP23, and SP24 is able to couple its respective switched capacitor CP21, CP22, CP23, and CP24 to a positive input signal INP (during the sampling phase) or the positive or negative references VREFP/VREFM (during a first portion of a convert phase). Additionally, each of the array switches from the negative half SM21, SM22, SM23, and SM24 is able to couple switched its respective capacitor CM21, CM22, CM23, and CM24 to a negative input signal INM (during the sampling phase) or to the positive or negative references VREFP/VREFM (during a first portion of a convert phase). Preferably, for a unit capacitance C, each capacitance for each capacitor in pairs CM21/CP21, CM22/CP22, CM23/CP23, and CM24/CP24 has a value of about C/8, C/16, C32, and C/64, respectively.

In contrast, fine array 220 employs larger capacitors, which is desirable for fine resolution of bits. As shown, array 220 has two halves (each corresponding to a portion of a differential input) with N stages. Each of the array switches from the positive half SP11 to SP1N is able to couple its respective switched capacitor CP11 to CP1N to a positive input signal INP (during the sampling phase) or to the positive or negative references VREFP/VREFM (during a second portion of a convert phase). Additionally, each of the array switches from the negative half SM11 to SM1N is able to couple switched its respective capacitor CM11 to CM1N to a negative input signal INM (during the sampling phase) or to the positive or negative references, VREFP/VREFM (during a first portion of a convert phase). Preferably, for a unit capacitance C, each capacitance for each capacitor in pairs CM11/CP11 to CM1N/CP1N has a value of about C to $C/2^{N-1}$, respectively.

The configuration of ADC 200-2 has several advantages over other conventional ADC with "convert and shut down" architectures. It allows a great deal of flexibility in that the ADC 200-2 can operate in two programmable modes. The higher resolution mode utilizes both the coarse and fine capacitor arrays 220 and 218 and both the coarse and fine comparators 210 and 208. A lower resolution mode operating at much lower power is achieved by powering down the fine capacitor array 220 and the fine comparator 208 and by using the coarse capacitor array 218 and coarse comparator 210 for resolving all the desired bits. Second, because smaller capacitors are employed in array 218, power consumption of ADC 200-2 is greatly reduced.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a switched capacitor array that receives an input signal;
    an amplifier;
    a first comparator that is coupled to the amplifier;
    a second comparator;
    a switch network that couples the switched capacitor array to the second comparator during a first portion of a convert phase so that the switched capacitor array and the second comparator resolve a first plurality of bits and that couples the switched capacitor array to the amplifier during a second portion of the convert phase so that the switched capacitor array and the first comparator resolve a second plurality of bits; and
    a feedback circuit that is coupled to the first comparator, the second comparator, and the switched capacitor array.

2. The apparatus of claim 1, wherein the switched capacitor array further comprises:
    a plurality of switches, wherein each switch receives the input signal; and
    a plurality of capacitors, wherein each capacitor is coupled to at least one of the switches.

3. The apparatus of claim 1, wherein the switched capacitor array further comprises:
    a first switched capacitor array having a first resolution that receives the input signal, wherein the switch network couples the first switched capacitor array to the amplifier during the second portion of the convert phase so that the first switched capacitor array and the first comparator resolve the second plurality of bits, and wherein the first switched capacitor array is coupled to the feedback circuit; and
    a second switched capacitor array having a second resolution that receives the input signal, wherein the first resolution is greater than the second resolution, wherein the switch network couples to the second switched capacitor array to the second comparator during the first portion of a convert phase so that the second switched capacitor array and the second comparator resolve the first plurality of bits, and wherein the second switched capacitor array is coupled to the feedback circuit.

4. The apparatus of claim 3, wherein the second switched capacitor array further comprises:
    a first switch;
    a first capacitor that is coupled to the first switch;
    a second switch that is coupled to first switch;
    a second capacitor that is coupled to the second switch;
    a third switch that is coupled to first switch;
    a third capacitor that is coupled to the third switch;

a fourth switch that is coupled to first switch; and
a fourth capacitor that is coupled to the fourth switch.

5. The apparatus of claim 3, wherein the switch network further comprises:
   a first switch that is coupled the first and second switched capacitor arrays, wherein first switch couples the first switched capacitor array to the amplifier during the second portion of the convert phase; and
   a second switch that is coupled to the amplifier, wherein the second switch coupled the amplifier to ground during the first portion of the convert phase; and
   a third switch that is coupled to the amplifier, wherein the third switch couples the amplifier to ground during the first portion of the convert phase.

6. The apparatus of claim 1, wherein the apparatus further comprises:
   an offset capacitor that is coupled between the amplifier and the first comparator; and
   a switch that is coupled to the first comparator, wherein the switch couples the first comparator to ground during the first portion of the convert phase.

7. The apparatus of claim 1, wherein the feedback circuit further comprises:
   a multiplexer that is coupled to the first comparator and to the second comparator; and
   successive approximation register (SAR) logic that is coupled to the multiplexer, the first switched capacitor array and the second switched capacitor array.

8. The apparatus of claim 1, wherein the switch network further comprises:
   a first switch that is coupled to the switched capacitor array, wherein the first switch is couples the switched capacitor array to ground during a sample phase;
   a second switch that is coupled the switched capacitor array, wherein second switch couples the switched capacitor array to the amplifier during the second portion of the convert phase; and
   a third switch that is coupled to the amplifier, wherein the third switch couples the amplifier to ground during the first portion of the convert phase.

9. An apparatus comprising:
   a switched capacitor array;
   a first switch that is coupled to the switched capacitor array, wherein the first switch couples at least a portion of the switched capacitor array to ground during a sampling phase;
   a first comparator that is coupled to the switched capacitor array, wherein the switched capacitor array and the first comparator resolve a first plurality of bits during a first portion of a convert phase;
   an amplifier having an input terminal and an output terminal;
   a second switch that is coupled between the switched capacitor array and the input terminal of the amplifier, wherein the second switch couples the switched capacitor array to the amplifier during a second portion of a convert phase;
   a third switch that is coupled to the input terminal of the amplifier, wherein the third switch couples the input terminal of the amplifier to ground during the first portion of the convert phase;
   an offset capacitor that is coupled to the output terminal of the amplifier;
   a second comparator that is coupled to the offset capacitor;
   a fourth switch that is coupled to second comparator, wherein the fourth switch couples the second comparator to ground during the first portion of the convert phase;
   a multiplexer that is coupled to the first comparator and the second comparator; and
   SAR logic that is coupled to the multiplexer and the switched capacitor array.

10. The apparatus of claim 9, wherein the switched capacitor array further comprises:
    a first switched capacitor array having a set of N branches, wherein the first switch couples at least a portion of the first switched capacitor array to ground during the sampling phase, and wherein the second switch couples the first switched capacitor array to the amplifier during the second portion of the convert phase; and
    a second switched capacitor array having a set of M branches, wherein N is greater than M, wherein the first switch couples at least a portion of the second switched capacitor array to ground during the sampling phase, and wherein the second switched capacitor array is coupled to the first comparator, and wherein the second switched capacitor array and the first comparator resolve the first plurality of bits during the first portion of the convert phase.

11. The apparatus of claim 10, wherein each branch further comprises:
    a digital-to-analog converter (DAC) capacitor that is coupled to the first switch; and
    an input switch that is coupled to the DAC capacitor.

12. The apparatus of claim 10, wherein M is 4.

13. A method comprising:
    sampling an input signal by a switched capacitor array during a sampling phase;
    powering up an amplifier during a first portion of a convert phase;
    resolving a first set of bits with the switched capacitor array, a first comparator, and a feedback circuit during the first portion of the convert phase; and
    resolving a second set of bits with the switched capacitor array, a second comparator, the amplifier, and a feedback circuit during a portion of the convert phase.

14. The method of claim 13, wherein the method further comprises grounding an input terminal of the amplifier during the first portion of the convert phase.

15. The method of claim 13, wherein the switched capacitor array further comprises a first switched capacitor array and a second switched capacitor array.

16. The method of claim 15, wherein the step of resolving the first set of bits further comprises resolving the first set of bits with the first switched capacitor array, a first comparator, and a feedback circuit during the first portion of the convert phase.

17. The method of claim 15, wherein the step of resolving the second set of bits further comprises resolving the second set of bits with the second switched capacitor array, a second comparator, the amplifier, and a feedback circuit during a portion of the convert phase.

* * * * *